United States Patent
Ooshima

(10) Patent No.: US 9,859,103 B2
(45) Date of Patent: Jan. 2, 2018

(54) PROCESS CONTROL DEVICE, RECORDING MEDIUM, AND PROCESS CONTROL METHOD

(71) Applicant: Toshiba Memory Corporation, Minato-ku (JP)

(72) Inventor: Kazuhiro Ooshima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 51 days.

(21) Appl. No.: 14/657,581

(22) Filed: Mar. 13, 2015

(65) Prior Publication Data

US 2016/0208395 A1    Jul. 21, 2016

(30) Foreign Application Priority Data

Jan. 20, 2015    (JP) .................. 2015-008834

(51) Int. Cl.
| | |
|---|---|
| *H01L 21/306* | (2006.01) |
| *H01J 37/32* | (2006.01) |
| *H01L 21/67* | (2006.01) |
| *H01L 21/762* | (2006.01) |
| *H01L 21/66* | (2006.01) |

(52) U.S. Cl.
CPC .. *H01J 37/32926* (2013.01); *H01J 37/32935* (2013.01); *H01J 37/32972* (2013.01); *H01L 21/67253* (2013.01); *H01L 21/76224* (2013.01); *H01L 22/26* (2013.01)

(58) Field of Classification Search
CPC ........... H01J 37/32917; H01J 37/32963; H01J 37/32972; H01J 37/32926; H01J 37/32935; C23F 4/00; H01L 21/3065; H01L 37/67253

USPC ........... 156/345.13, 345.16, 345.21, 345.25; 438/7, 706, 710, 712, 714, 740
See application file for complete search history.

(56) References Cited

U.S. PATENT DOCUMENTS

| | | | |
|---|---|---|---|
| 8,083,960 B2 | 12/2011 | Uchida et al. | |
| 2006/0039008 A1* | 2/2006 | Usui | G01B 11/0625 356/504 |
| 2006/0040415 A1* | 2/2006 | Chou | H01J 37/3244 438/9 |

(Continued)

FOREIGN PATENT DOCUMENTS

| | | |
|---|---|---|
| JP | 5192850 | 5/2013 |
| JP | 2013-217776 | 10/2013 |
| JP | 5384758 | 1/2014 |

*Primary Examiner* — Lan Vinh
(74) *Attorney, Agent, or Firm* — Oblon, McClelland, Maier & Neustadt, L.L.P.

(57) ABSTRACT

According to one embodiment, a process control device includes an emission amount calculation unit and a process control unit. The emission amount calculation unit selects light of a predetermined wavelength among light generated while a dry etching process is being executed on a substrate. The process control unit calculates an integral value which is obtained by integrating an emission intensity of the selected light with time of detecting the selected light. Further, the process control unit calculates a total amount of the integral value as a total emission amount at the substrate. Further, the process control unit outputs an instruction to stop the dry etching process when the total emission amount reaches a predetermined reference value.

20 Claims, 6 Drawing Sheets

(56) References Cited

U.S. PATENT DOCUMENTS

2013/0109112 A1* 5/2013 Grimbergen .............. G03F 1/80
    438/16
2013/0265587 A1   10/2013 Goto et al.

* cited by examiner

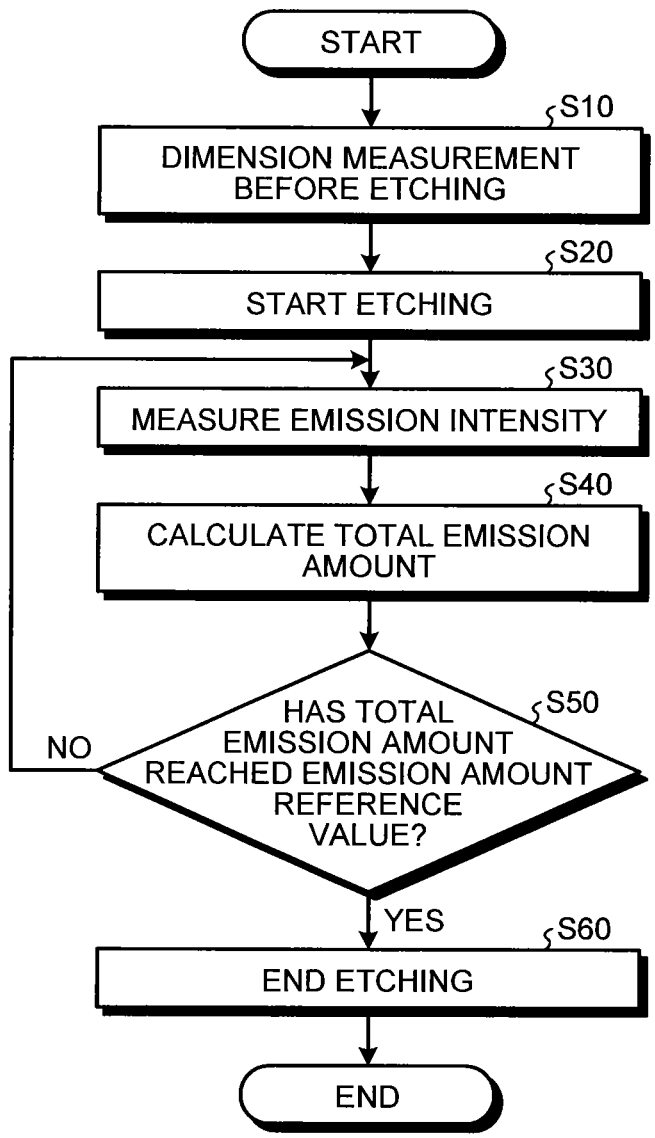

PROCESS CONTROL DEVICE, RECORDING MEDIUM, AND PROCESS CONTROL METHOD

CROSS-REFERENCE TO RELATED APPLICATIONS

This application is based upon and claims the benefit of priority from Japanese Patent Application No. 2015-008834, filed on Jan. 20, 2015; the entire contents of which are incorporated herein by reference.

FIELD

An embodiment described herein relates generally to a process control device, a recording medium, and a process control method.

BACKGROUND

In a dry etching process using plasma, an etching amount needs to be controlled. As a method for controlling the etching amount, there is a method for controlling etching time of the dry etching process. Further, as a method for controlling the etching amount, there is a method for measuring an after-etching dimension of a pattern after executing a dry etching process and controlling an etching amount by giving the measured dimension values as feedback. However, with the above two methods, it has been difficult to accurately control the etching amount.

BRIEF DESCRIPTION OF THE DRAWINGS

FIG. 3 is a flowchart illustrating a procedure of an etching process according to the embodiment;

DETAILED DESCRIPTION

According to an embodiment, a process control device is provided. The process control device includes an emission amount calculation unit and a process control unit. The emission amount calculation unit selects light of a predetermined wavelength among light generated while dry etching process using plasma is being executed on a substrate. Then, the process control unit calculates an integral value which is obtained by integrating an emission intensity of the selected light with time of detecting the selected light. Further, the process control unit calculates a total value of the integral value as a total emission amount at the substrate. Further, the process control unit outputs an instruction to stop the dry etching process when the total emission amount reaches a reference value.

Exemplary embodiments of a process control device, a recording medium, and a process control method will be explained below in detail with reference to the accompanying drawings. The present invention is not limited to the following embodiments.

Embodiment

Figure 1:
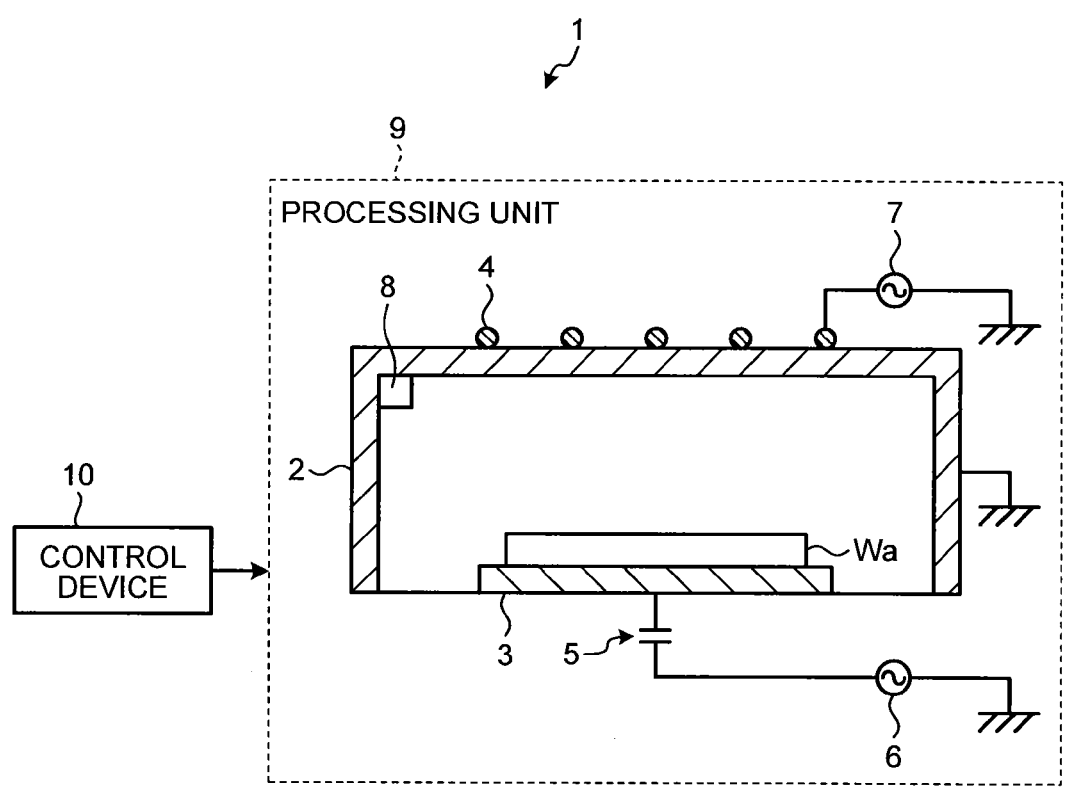
FIG. 1 is a diagram illustrating a configuration of a dry etching apparatus according to an embodiment.

FIG. 1 is a diagram illustrating a configuration of a dry etching apparatus according to an embodiment. The dry etching apparatus 1 includes a processing unit 9 and a control device (a process control device) 10. The dry etching apparatus 1 is an apparatus to perform a dry etching process on a substrate such as a wafer Wa. The dry etching apparatus 1 according to the embodiment controls an etching amount based on an emission intensity when performing etching.

The processing unit 9 includes a chamber 2, a stage 3, an antenna coil 4, a blocking condenser 5, radio-frequency power sources 6 and 7, and an emission intensity measurement unit 8. Here, although it is not illustrated, the dry etching apparatus 1 includes a gas supply unit that supplies a reactive gas to the chamber 2 and an exhaust unit that exhausts air in the chamber 2 outside the chamber 2.

The chamber 2 is a processing room in which RIE (Reactive Ion Etching) is performed. The chamber 2 is connected to a ground and includes the stage 3 therein. The stage 3 is a table to hold a semiconductor substrate (a processing target substrate) such as a wafer Wa placed thereon. The stage 3 is connected to the ground via the blocking condenser 5 and the radio-frequency power source 6. The antenna coil 4 is a coil which is spiral in a planar view and is provided on a top panel of the chamber 2. The antenna coil 4 is connected to the ground via the radio-frequency power source 7.

The dry etching apparatus 1 introduces a reactive gas into the chamber 2. The dry etching apparatus 1 applies a radio-frequency voltage from the radio-frequency power source 7 to the antenna coil 4 while the chamber 2 is kept in a vacuum state. Further, the dry etching apparatus 1 applies a radio-frequency voltage from the radio-frequency power source 6 to the stage 3 to generate plasma of the reactive gas.

An electron in plasma is pulled to the ceiling of the chamber 2 facing the antenna coil 4 and to the stage 3. Since the chamber 2 is connected to the ground, the electron pulled to the ceiling of the chamber 2 flows to the ground. Thus, the potential at the ceiling of the chamber 2 is kept constant. On the other hand, since the blocking condenser 5 blocks the direct current, the pulled electrons are accumulated and its upper electrode is negatively charged.

The dry etching apparatus 1 performs RIE by inducing positive ions in plasma to the negatively charged blocking condenser 5 and letting the ions collide with the wafer Wa placed on the stage 3.

The emission intensity measurement unit 8 measures the intensity of the light (an emission intensity) generated while etching (a dry etching process using plasma) is performed on the wafer Wa. When etching is performed in the chamber 2, light of a wavelength corresponding to a film to be etched on the wafer Wa and the type of gas used in etching. The emission intensity measurement unit 8 measures the emission intensity and transmits a measurement result to the control device 10. The emission intensity measurement unit 8 is placed in the chamber 2, for example.

The control device 10 is connected to the processing unit 9 and controls the processing unit 9. The control device 10 according to the present embodiment controls an end timing of RIE based on the emission intensity. The control device 10 adds integral values of emission intensity waveforms corresponding to a predetermined wavelength and, when the total value (the sum) of the integral values reaches a previously set value, it is determined to be an end timing of RIE.

Figure 2:
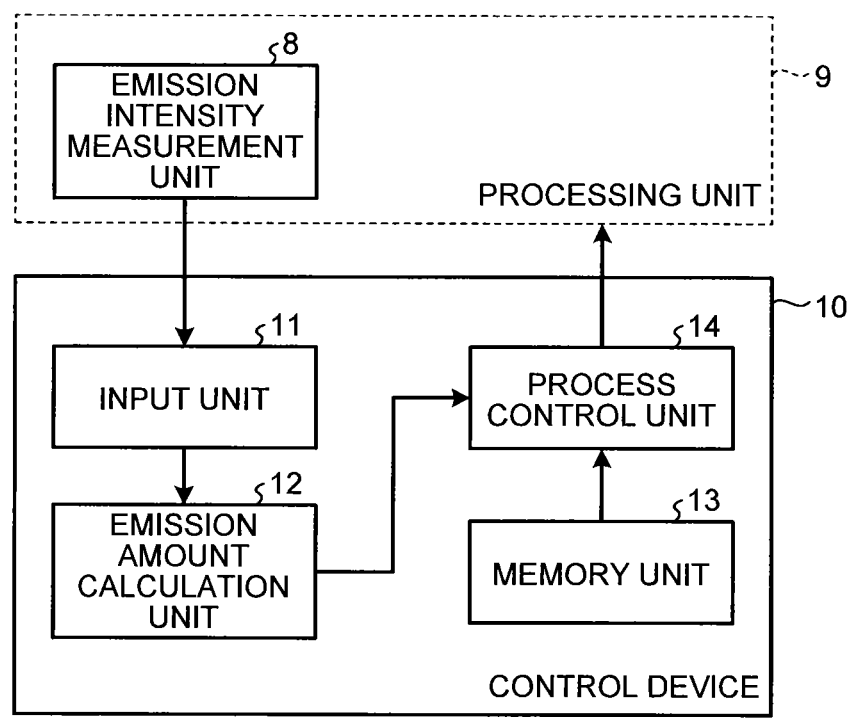
FIG. 2 is a diagram illustrating a control device according to the embodiment.

FIG. 2 is a diagram illustrating a configuration of the control device according to the embodiment. The control device 10 includes an input unit 11, an emission amount calculation unit (an emission amount calculation module) 12, a memory unit 13, and a process control unit (a process control module) 14. The input unit 11 is connected to the emission intensity measurement unit 8 of the processing unit 9. The input unit 11 receives the emission intensity transmitted from the emission intensity measurement unit 8 and transmits the emission intensity to the emission amount calculation unit 12.

Further, a processing condition is input to the input unit 11 by a user or the like. The input unit 11 transmits the input processing condition to the emission amount calculation unit 12. To the input unit 11, for example, later described information (1) to (8) is input as a processing condition. Here, to the input unit 11, for example, information indicating a combination of later described (1) to (8) may be input as the processing condition.

The emission amount calculation unit 12 selects light of a predetermined wavelength among the measured light and calculates a total value of emission amounts (hereinafter, referred to a total emission amount) based on the waveform of the emission intensity of the selected light. The total emission amount calculated by the emission amount calculation unit 12 is a total amount of values obtained by integrating the emission intensity with processing time. The emission amount calculation unit 12 calculates a total emission amount of emission light of a wavelength corresponding to the film to be etched and an etching gas. Concretely, the emission amount calculation unit 12 extracts a waveform of a wavelength corresponding to the film to be etched and the etching gas from emission intensities waveforms. Then, the emission amount calculation unit 12 executes a time integration of extracted waveforms (integrating with time of detecting the selected light) and summate the time integrated values (areas). The emission amount calculation unit 12 transmits the calculated total value to the process control unit 14 as a total emission amount. Further, the emission amount calculation unit 12 transmits the processing condition transmitted from the input unit 11 to the process control unit 14.

The memory unit 13 stores an emission amount reference value of each processing condition. The emission amount reference value is a reference value used to determine whether to end the etching process. Thus, when the calculated total emission amount reaches the reference value, the etching process ends.

The emission amount reference value is set for each processing condition. As the processing condition, there are power, pressure, a gas type or the like during etching. The processing condition may be the following (1) to (8), for example.
(1) type of film to be etched
(2) type of etching gas
(3) TCP (Transformer Coupled Plasma) power during etching
(4) bias power during etching
(5) pressure in chamber 2 during etching
(6) gas flow rate during etching
(7) duty cycle during etching
(8) aperture ratio of wafer Wa The type of etching gas indicated by (2) is a type of main gas used in etching. As the main gas, there are chlorine, fluorine and the like, for example. The gas flow rate during etching indicated by (6) is a flow rate of a main gas used in etching. The duty cycle during etching indicated by (7) is a ratio of time when the bias voltage is applied with respect to the entire time of a cycle in which the bias voltage is turned on and off.

The aperture ratio of the wafer Wa indicated by (8) is a ratio (coverage rate) of the area of the film to be etched with respect to the entire area of the upper face of the wafer Wa. On the wafer Wa, a mask material is formed on the upper part of the film to be etched. Then, of the wafer Wa, a part on which the mask material is not formed is etched. For example, the upmost layer face of the wafer Wa is the mask material such as a line pattern and the part on which mask material is not placed is a space pattern. On such a wafer Wa, the space pattern and lower layers are etched. Then, the area of the space pattern with respect to the entire area of the upper surface of the wafer Wa is an aperture ratio of the wafer Wa.

The memory unit 13 stores, for example, a correspondence relation between the processing condition which is a combination of the above (1) to (8) and the emission amount reference values.

The process control unit 14 extracts, from the memory unit 13, an emission amount reference value corresponding to the processing condition which is specified by the user. The process control unit 14 determines whether or not the total emission amount transmitted from the emission amount calculation unit 12 has reached the extracted emission amount reference value. When the total emission amount transmitted from the emission amount calculation unit 12 has reached the emission amount reference value, the process control unit 14 transmits an etching process end instruction to the processing unit 9.

Next, a procedure of the etching process according to the embodiment will be explained. FIG. 3 is a flowchart illustrating a procedure of the etching process according to the embodiment. Before etching starts, a dimension measurement prior to etching is executed (step S10). The dimension measurement prior to etching is a process that is executed after a completion of a process prior to etching. In the dimension measurement prior to etching, a dimension of the pattern on the wafer Wa is measured. Concretely, in the dimension measurement prior to etching, for example, the dimension of the mask pattern used in etching, the dimension of a part of the film to be etched where is not covered by the mask and the like are measured.

Then, when the user inputs a processing condition to the control device 10, the dry etching apparatus 1 starts etching on the wafer Wa (step S20). Here, the control device 10 controls the processing unit 9 so that the wafer Wa is etched in the processing condition specified by the user.

When the processing unit 9 starts etching, the emission intensity measurement unit 8 measures the emission intensity near the wafer Wa (step S30). The emission intensity measurement unit 8 transmits the measured emission intensity (measured result) to the control device 10. The input unit 11 of the control device 10 receives the emission intensity transmitted from the emission intensity measurement unit 8 and transmits the emission intensity to the emission amount calculation unit 12. The emission amount calculation unit 12 calculates a total emission amount based on the waveform of the emission intensities (step S40).

Figure 4A:
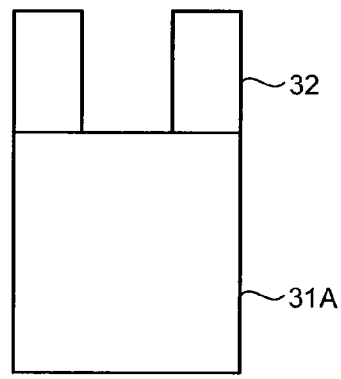
FIGS. 4A to 4C are diagrams for explaining a process example of the etching process.
Figure 4B:
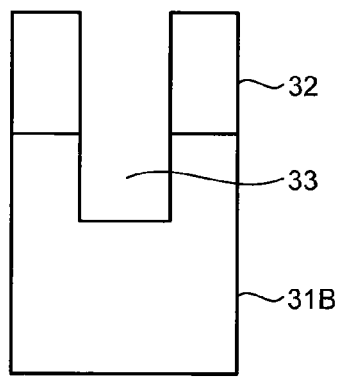
Figure 4C:
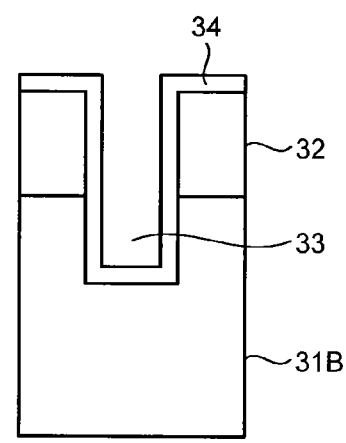

FIGS. 4A to 4C are diagrams to explain a process example of the etching process. FIGS. 4A to 4C illustrate sectional views of the pattern formed on the wafer Wa. As illustrated in FIG. 4A, a mask 32 is formed on a film to be etched 31A on the wafer Wa. Then, to the wafer Wa, etching is executed over the mask 32.

When the film to be etched 31A is etched using the mask 32 as a mask, the film to be etched 31A becomes a film to be etched 31B having a depressed portion 33 as illustrated in FIG. 4B.

After that, as illustrated in FIG. 4C, a sidewall protection film 34 is formed on the wafer Wa. The sidewall protection film 34 is a film to protect sidewalls of the mask 32. The sidewall protection film 34 is formed to cover the upper face and sidewall face of the mask 32, the bottom face and sidewall face of the depressed portion 33.

After that, the process to deepen the film to be etched 31B illustrated in FIG. 4B (the process to deepen the depressed portion 33) and the process to form the sidewall protection film 34 illustrated in FIG. 4C are repeated. The repetition of the processes of FIGS. 4B and 4C is an etching cycle process. By the etching cycle process, the depressed portion 33 having a predetermined depth is formed on the film to be etched 31B.

According to the present embodiment, the emission intensity during etching is measured to end the etching with a desired depth of the depressed portion 33. Then, based on the emission intensity during etching, the total emission amount is calculated and, based on the total emission amount, an etching end timing is determined.

Figure 5A:
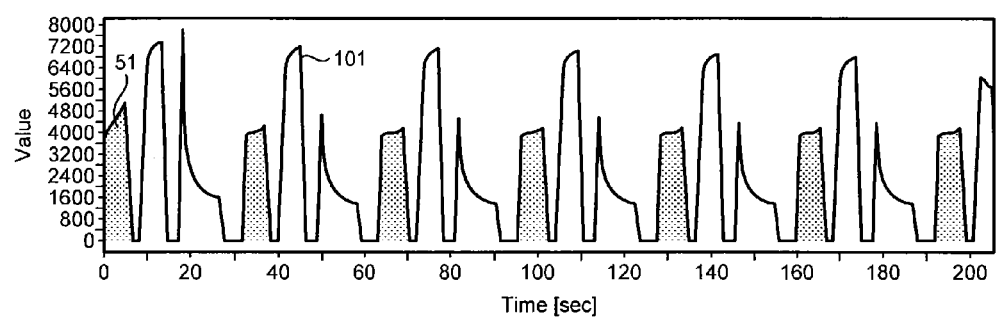
FIGS. 5A and 5B are diagrams illustrating waveform examples of emission intensities.
Figure 5B:
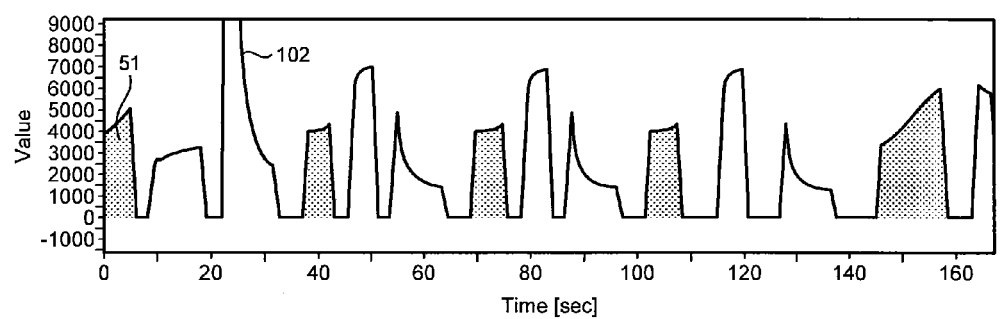

FIGS. 5A and 5B are diagrams illustrating waveform examples of emission intensities. Here, waveform examples a case of forming a laminated structure of a gate oxide film layer and a Poly layer formed on the wafer Wa using the RIE method will be explained.

FIG. 5A illustrates a first waveform example of an emission intensity (an emission intensity characteristic 101) and FIG. 5B illustrates a second waveform example of an emission intensity (an emission intensity characteristic 102). The horizontal axes of the diagrams in FIGS. 5A and 5B represent time and the vertical axes represent emission intensities.

The emission intensity characteristic 101 indicates a characteristic of a case that an etching process (Si process) is repeated five times on a single wafer Wa. Further, the emission intensity characteristic 102 indicates a characteristic of a case that the etching process is repeated seven times on a single wafer Wa. In the etching process, the following condition is used, for example.

TCP Power: 700 W
Bias Voltage: 650 W
$CL_2$: 100 sccm
$O_2$: 0 to 10 sccm
pressure: 15 mTorr
duty cycle: 15 to 30%

The emission intensity characteristics 101 and 102 are different from each other at various timings. In other words, the emission intensity characteristics 101 and 102 have a plurality of waves (convex wave). Among timings (waves) that the emission intensity becomes large, a wave caused by the etching process on the wafer Wa is a wave 51. The wave 51 is a wave that is corresponding to an emission of wavelength 425 nm, for example. In other words, among plasma emissions obtained during processing of Si (a silicon film), an emission of wavelength 425 nm is a wave 51.

In the emission intensity characteristics 101 and 102, waves other than the wave 51 are waves generated in a process which is different from etching (shape maintenance process or the like). In the processing unit 9, the etching process and a non-etching process are repeated.

The emission amount calculation unit 12 calculates an emission amount of the wave 51 generated in the etching process. In this case, the emission amount calculation unit 12 calculates the emission amount of the wave 51 by integrating the emission intensity with a processing time (period of time when the wave 51 is generated). Since the wave 51 is generated more than once, the emission amount calculation unit 12 calculates an emission amount of each wave 51. Then, the emission amount calculation unit 12 calculates a total emission amount by adding the emission amounts of each wave 51.

When the etching process is executed five times on a single wafer Wa, the emission amount calculation unit 12 calculates a total emission amount of the five waves 51. Further, when the etching process is executed seven times on a single wafer Wa, the emission amount calculation unit 12 calculates the total emission amount of the seven waves 51.

The emission amount calculation unit 12 transmits the calculated total emission amount to the process control unit 14. Further, the emission amount calculation unit 12 transmits the processing condition transmitted from the input unit 11 to the process control unit 14.

The process control unit 14 extracts, from the memory unit 13, the emission amount reference value corresponding to the processing condition transmitted from the input unit 11. The process control unit 14 determines whether or not the total emission amount transmitted from the emission amount calculation unit 12 has reached the extracted emission amount reference value (step S50).

When the total emission amount transmitted from the emission amount calculation unit 12 has not reached the extracted emission amount reference value (step S50, No), the process control unit 14 does not transmit an etching process end instruction to the processing unit 9. As a result, in the processing unit 9, the etching process continues. With this, the emission intensity measurement unit 8 continues to measure the emission intensity (step S30). Then, the emission amount calculation unit 12 continues to calculate total emission amounts (step S40). Here, the process control unit 14 continues to determine whether or not the total emission amount transmitted from the emission amount calculation unit 12 has reached the emission amount reference value (step S50).

When the total emission amount transmitted from the emission amount calculation unit 12 reaches the extracted emission amount reference value (step S50, Yes), the process control unit 14 transmits an etching process end instruction to the processing unit 9.

With this, the processing unit 9 ends etching (step S60) and conveys the wafer Wa outside. When the control device 10 controlled etching to maintain the total emission amount to be previously set 196000, a desired Si trench depth was obtained regardless of the number of Si process steps.

According to the present embodiment, with the same total emission amount, the same trench depth can be obtained. In other words, when an etching process is executed on a single wafer Wa "N" number of times (N is a natural number), a trench depth corresponding to the total emission amount can be obtained if the total emission amount is the same. For example, when the total emission amount of a case that the etching process is executed five times and the total emission amount of a case that the etching process is executed seven times are the same, same trench depth can be obtained.

Here, the control device 10 calculates total emission amounts of plural wavelengths and controls the etching amount based on the calculated total emission amount. In this case, a plurality of ranges of emission amount reference values (an emission amount reference range) are set for each wavelength in advance. For example, in the memory unit 13, a first emission amount reference range (196000±1000, for example) corresponding to a first wavelength (a wavelength 425 nm, for example) and a second emission amount reference range (220000±2000, for example) corresponding to a second wavelength (a wavelength 256 nm, for example) are stored.

Then, the emission amount calculation unit 12 calculates a first total emission amount of a first wavelength and a second total emission amount of a second wavelength among plasma emission generated in etching. Further, the process control unit 14 determines an etching end timing at the timing when the first total emission amount becomes within the first emission amount reference range and the second total emission amount become within the second emission amount reference range. With this, the control device 10 can control so that a film thickness of the remained mask film and a film thickness of the film to be etched to be in a desired thickness. As a result, with the dry etching apparatus 1, a desired remained mask thickness and a desired Si trench depth are obtained, for example.

Here, the emission amount calculation unit 12 may stop etching when the first total emission amount changes from a value within the first emission amount reference range to a value out of the first emission amount reference range. Further, the emission amount calculation unit 12 may stop etching when the second total emission amount changes from a value within the second emission amount reference range to a value out of the second emission amount reference range.

Further, the emission amount calculation unit 12 may determine an etching end timing at a timing when the first total emission amount reaches the first emission amount reference value (195000, for example) and the second total emission amount reaches the second emission amount reference value (219600, for example).

Further, the emission amount calculation unit 12 may determine an etching end timing at a timing when the first total emission amount reaches the first emission amount reference value or the second total emission amount reaches the second emission amount reference value.

Further, the emission amount calculation unit 12 may determine an etching end timing based on three or more total emission amount of light and an emission amount reference value or an emission amount reference range corresponding to each light.

On the other hand, when the etching end time is determined based on the etching time, variation in etching amount becomes larger. Further, there is a method to determine the etching end time using an APC (Advanced Process Control). In this method, after completing etching at a predetermined amount, the dimension of the pattern (a dimension after etching) on the wafer Wa is measured. Then, the measured result is given as feedback for next wafer process. With this, etching on a next wafer Wa is completed at a timing corresponding to the measured result. However, in this method, since there is a time lag before the feedback becomes effective, some lots may have an uncontrolled depth. According to the present embodiment, since the timing to end etching can be calculated during the etching, a proper etching control can be executed for all the lots without any time lags.

The dry etching apparatus 1 is used, for example, in a production process for forming a trench for an STI (Shallow Trench Isolation) by RIE. Here, the semiconductor device production method according to the present embodiment can be applied any semiconductor device production method which includes dry etching in the production process.

The dry etching apparatus 1 is used for example, in each layer of a wafer process. When a semiconductor device (semiconductor integrated circuit) is produced, a film to be etched is formed on a wafer Wa. Then, resist is applied on the film to be etched. After that, exposure is executed, using a photomask or the like, on the wafer Wa to which resist is applied. After that, by developing the wafer Wa, a resist pattern is formed on the wafer Wa. Then, using the resist pattern as a mask, the film to be etched is etched by the dry etching apparatus 1. With this, an actual pattern corresponding to the resist pattern is formed on the wafer Wa. When producing the semiconductor device, a forming process of a film to be etched, an applying process of a resist, an exposing process, a developing process, an etching process and the like are repeated on each layer. Here, when a semiconductor device is produced, an imprinting process may be used as a substitute for the exposing process and the developing process.

Figure 6:
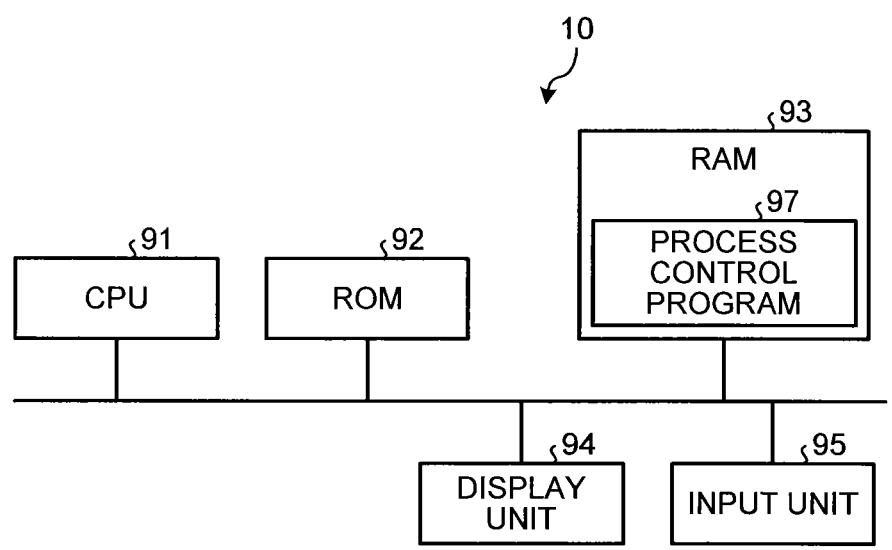
FIG. 6 is a diagram illustrating a hardware configuration of the control device according to the embodiment.

Next, a hardware configuration of the control device 10 will be explained. FIG. 6 is a diagram illustrating the hardware configuration of the control device. The control device 10 includes a CPU (Central Processing Unit) 91, ROM (Read Only Memory) 92, RAM (Random Access Memory) 93, a display unit 94, and an input unit 95. In the control device 10, the CPU 91, the ROM 92, the RAM 93, the display unit 94 and the input unit 95 are connected via a bus line.

The CPU 91 executes a pattern judgment using a process control program 97 which is a computer program. The process control program 97 is a computer executable computer program product having a nontransitory computer readable recording medium which can be read by a computer and includes a plurality of instructions to control process. With the process control program 97, the plurality of instructions cause a computer to control process.

The display unit 94 is a display such as a liquid-crystal monitor and displays, based on an instruction from the CPU 91, a processing condition, an emission intensity waveform, a total emission amount, an emission amount reference value, an etching condition (etching being executed, etching ended) or the like. The input unit 95 includes a mouse, a keyboard and the like to input instruction information (a parameter, a processing condition or the like required for the process control) which is externally input by a user. The instruction information input to the input unit 95 is transmitted to the CPU 91.

The process control program 97 is stored in the ROM 92 and loaded to the RAM 93 via the bus line. FIG. 6 illustrates a condition in which the process control program 97 is loaded to the RAM 93.

The CPU 91 executes the process control program 97 loaded in the RAM 93. Concretely, in the control device 10, the CPU 91 reads the process control program 97 from the ROM 92 and develops the process control program 97 in a program storage area in the RAM 93 to execute various processes according to an instruction input by the user via the input unit 95. The CPU 91 temporarily stores various data generated in those various processes in a data storage area formed in the RAM 93.

The process control program 97 executed by the control device 10 has a module configuration including the emission amount calculation unit 12 and the process control unit 14 and those are loaded to a main memory and generated in the main memory.

As described above, according to the embodiment, the emission amount calculation unit calculates a total emission amount and, when the total emission amount reaches a predetermined reference value, the process control unit outputs an instruction to stop dry etching process so that the dry etching process can be stopped at a timing corresponding to the total emission amount. Thus, the etching amount can be accurately controlled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A process control device, comprising:
   an emission amount calculation unit configured to select light of a selected wavelength among light generated by a dry etching process using plasma is being executed on a substrate, calculate an integral value which is obtained by integrating an emission intensity of the selected light over a period of time during which the selected light is detected, and calculate a total value of the integral value as a total emission amount at the substrate; and
   a process control unit configured to output an instruction to stop the dry etching process when the total emission amount reaches a predetermined reference value.

2. The process control device according to claim 1, wherein the emission amount calculation unit selects, as the light of the selected wavelength, light generated while a film to be etched, which is placed in a lower layer of a mask pattern on the substrate, is being formed.

3. The process control device according to claim 1, wherein the emission amount calculation unit selects, as the light of the selected wavelength, light of a wavelength corresponding to a type of a film to be etched and a type of gas used in the dry etching process.

4. The process control device according to claim 1, wherein
   the emission amount calculation unit selects, as the light of the selected wavelength, first light having a first wavelength and second light having a second wavelength and calculates, as the total emission amount, a first total emission amount of the first light and a second total emission amount of the second light, and
   the process control unit outputs an instruction to stop the dry etching process when the first total emission amount reaches a first reference value and the second total emission amount reaches a second reference value.

5. The process control device according to claim 4, wherein the emission amount calculation unit selects, as the first light, light generated while a film to be etched, which is placed in a lower layer of a mask pattern on the substrate, is being formed and selects, as the second light, light generated while the mask pattern is being formed.

6. The process control device according to claim 4, wherein the emission amount calculation unit selects, as the light of the first wavelength, light of a wavelength corresponding to a type of a film to be etched and a type of gas used in the dry etching process and selects, as the light of the second wavelength, light of a wavelength corresponding to a type of a film of the mask pattern and the type of gas.

7. The process control device according to claim 1, wherein
   the emission amount calculation unit selects, as the light of the selected wavelength, first light having a first wavelength and second light having a second wavelength and calculates, as the total emission amount, a first total emission amount of the first light and a second total emission amount of the second light, and
   the process control unit outputs an instruction to stop the dry etching process when the first total emission amount becomes within a first reference range and the second total emission amount becomes within a second reference range.

8. The process control device according to claim 1, wherein the reference value is a value that is set corresponding to power, pressure and a gas type of the dry etching process.

9. A nontransitory computer readable recording medium in which a process control program for causing a computer to control a dry etching process using plasma on a substrate is recorded, the process control program causing the computer:
   to select light of a wavelength among light generated by the dry etching process being executed, calculate an integral value which is obtained by integrating an emission intensity of the selected light with time of detecting the selected light, and calculate a total value of the integral value as a total emission amount at the substrate; and
   to output an instruction to stop the dry etching process when the total emission amount reaches a predetermined reference value.

10. The recording medium according to claim 9, wherein when selecting light of the selected wavelength, light generated while a film to be etched, which is placed in a lower layer of a mask pattern on the substrate, is being formed, is selected as the light of the selected wavelength.

11. The recording medium according to claim 9, wherein when selecting light of the selected wavelength, light of a wavelength corresponding to a type of a film to be etched and a type of gas used in the dry etching process is selected as the light of the selected wavelength.

12. The recording medium according to claim 9, wherein first light having a first wavelength and second light having a second wavelength are selected as the light of the selected wavelength and a first total emission amount of the first light and a second total emission amount of the second light are calculated as the total emission amount, and
   an instruction to stop the dry etching process is output when the first total emission amount reaches a first reference value and the second total emission amount reaches a second reference value.

13. The recording medium according to claim 12, wherein when light of the selected wavelength is selected, light generated while forming a film to be etched, which is placed in a lower layer of a mask pattern on the substrate, is selected as the first light and light generated while forming the mask pattern is selected as the second light.

14. The recording medium according to claim 12, wherein light of a wavelength corresponding to a type of a film to be etched and a type of gas used in the dry etching process is selected as light of the first wavelength, and light of a wavelength corresponding to a type of a film of the mask pattern and the type of the gas is selected as light of the second wavelength.

15. The recording medium according to claim 9, wherein first light having a first wavelength and second light having a second wavelength are selected as the light of the selected wavelength, and a first total emission amount of the first light and a second total emission amount of the second light are calculated as the total emission amount, and an instruction to stop the dry etching process is output when the first total emission amount becomes within a first reference range and the second total emission amount becomes within a second reference range.

16. The recording medium according to claim 9, wherein the reference value is a value that is set according to power, pressure, and a gas type of the dry etching process.

17. A process control method comprising:

selecting light of a selected wavelength among light generated by a dry etching process using plasma being executed on a substrate;

calculating an integral value which is obtained by integrating an emission intensity of the selected light with time of detecting the selected light;

calculating a total value of the integral value as a total emission amount at the substrate; and outputting an instruction to stop the dry etching process when the total emission amount reaches a predetermined reference value.

18. The process control method according to claim 17, wherein when selecting light of the selected wavelength, light generated while forming a film to be etched, which is placed in a lower layer of a mask pattern on the substrate, is selected as the light of the selected wavelength.

19. The process control method according to claim 17, wherein when selecting light of the selected wavelength, light of a wavelength corresponding to a type of the film to be etched and a type of gas used in the dry etching process is selected as the light of the selected wavelength.

20. The process control method according to claim 18, wherein at least one of the films to be etched is a silicon film.

* * * * *